United States Patent
Hyman et al.

(10) Patent No.: US 10,389,369 B1
(45) Date of Patent: Aug. 20, 2019

(54) EMULATION OF COMMUNICATION WAVEFORMS

(71) Applicant: IXI Technology Holdings, Inc., Yorba Linda, CA (US)

(72) Inventors: Daniel Hyman, Long Beach, CA (US); Jeffrey Norris, Lake Forest, CA (US); Joe Truong, Fountain Valley, CA (US); Michael Dekoker, Huntington Beach, CA (US); Anthony Aquino, Brea, CA (US)

(73) Assignee: IXI TECHNOLOGY HOLDINGS, INC., Yorba Linda, CA (US)

( * ) Notice: Subject to any disclaimer, the term of this patent is extended or adjusted under 35 U.S.C. 154(b) by 0 days.

(21) Appl. No.: 16/154,152

(22) Filed: Oct. 8, 2018

(51) Int. Cl.
| | |
|---|---|
| *H04L 27/12* | (2006.01) |
| *H03L 7/099* | (2006.01) |
| *H03L 7/04* | (2006.01) |
| *H03F 3/24* | (2006.01) |
| *H03L 7/093* | (2006.01) |

(52) U.S. Cl.
CPC ............ *H03L 7/099* (2013.01); *H03F 3/24* (2013.01); *H03L 7/04* (2013.01); *H03L 7/093* (2013.01); *H03F 2200/451* (2013.01)

(58) Field of Classification Search
USPC ............ 375/272, 273, 275, 302, 303, 308; 455/22, 73
See application file for complete search history.

(56) References Cited

U.S. PATENT DOCUMENTS

| | | | | |
|---|---|---|---|---|
| 6,028,885 A | * | 2/2000 | Minarik | H04B 1/713 375/135 |
| 7,352,995 B2 | * | 4/2008 | Pasternak | H04B 1/18 333/202 |

* cited by examiner

*Primary Examiner* — An T Luu
(74) *Attorney, Agent, or Firm* — Jovan N. Jovanovic; The Watson IP Group PLC

(57) ABSTRACT

An apparatus is comprised of a processor, a tuning voltage generator, a tuning circuit, an amplifier, and a voltage-controlled oscillator (VCO). The processor generates a tuning voltage command and a modulation command signal. The tuning voltage generator, coupled to the processor, receives the tuning voltage command and generates a baseline analog tuning signal based on the received tuning voltage command. The amplifier, coupled to the tuning voltage generator, receives the baseline analog tuning signal and the modulation signal, and generates a tuning signal based on the received baseline analog tuning signal and the received modulation command signal. The VCO, coupled to the amplifier, receives the tuning signal, generates a modulated radio frequency output signal based on the received tuning signal, and outputs the modulated radio frequency output signal, the modulated radio frequency output signal emulating a communication waveform.

20 Claims, 4 Drawing Sheets

EMULATION OF COMMUNICATION WAVEFORMS

CROSS-REFERENCE TO RELATED APPLICATION

N/A

BACKGROUND OF THE DISCLOSURE

1. Field of the Disclosure

The disclosure relates in general to communication waveforms, and more particularly, to emulation of communication waveforms. Such emulation is not limited to countering drones, however, such emulation is particularly useful to disable and/or disrupt drones.

2. Background Art

Conventional high-data-rate communication systems are limited in a number of waveforms that they support with different modulation methods and/or speed of channel, or mode selection. Systems with both great speed and many options for waveforms and/or modes of operation are significantly more expensive and consume greater power.

Existing circuits could be used to modify an input tuning voltage of a Voltage Controlled Oscillator (VCO) in a rapid manner to emulate a frequency or phase shift keying. Circuits exist that are specifically designed for modulation of an already generated Radio Frequency (RF) carrier signal. The most typically used example of such a circuit is an upconverting mixer, which takes an incoming carrier wave and mixes this with a high-speed baseband signal or intermediate RF signal to create a frequency modulated waveform. If the particular mixer provides for the ability to mix both in-phase and quadrature content (I-Q mixing), then the full range of frequency, phase, and amplitude modulation techniques are available.

An example of such a prior art circuit 500 is shown in FIG. 5, representing the state of the art in communications waveform generation. A direct-digital-synthesizer (DDS) 1 generates an intermediate frequency RF wave and modulates this signal with data which may be encoded using CDMA or other techniques. At output of the DDS 1 is a pair of in-phase and quadrature-phase signals containing this data which are then sent to an active I-Q upconverting mixer. A carrier wave passes into this mixer, which triggers generation of an output waveform that contains the frequency, amplitude, and phase content of a modulated signal. This output waveform is typically isolated from an original input carrier and original input I-Q modulation signals when properly implemented.

As shown in FIG. 5, the example circuit 500 utilizes the DDS 1 that includes an in-phase waveform synthesizer 3 and a quadrature waveform synthesizer 6. The DDS 1 is sent in-phase data 2 into the in-phase waveform synthesizer 3 to generate a differential signal comprised of a raw in-phase modulation high signal 4 relative to a raw in-phase modulation low-signal 4'. This differential signal may be either a current-based signal or a voltage-based signal generated by the DDS 1 depending on its specific circuit characteristics. In addition to the differential in-phase signal, a differential quadrature signal is also generated by the DDS 1. Quadrature data 5 is sent into the quadrature waveform synthesizer 6 to generate a differential quadrature signal comprised of a raw quadrature modulation high signal 7 relative to a raw quadrature modulation low-signal 7'.

Disposed between the DDS 1 and an I-Q modulator 20 are an in-phase active filter 13 and a quadrature active filter 16. The differential in-phase and quadrature signals will typically be conditioned prior to their introduction to the modulator portion of the circuit. Such conditioning would typically involve filtering, translation from current to voltage, and possibly buffering or amplification. In the example circuit 500, the raw in-phase modulation high signal 4 and a raw in-phase modulation low-signal 4' are sent into the in-phase active filter 13 which filters, amplifies, and translates the signal to voltage, creating the conditioned in-phase modulation high signal 14 relative to a conditioned in-phase modulation low signal 14'. In a similar manner, the quadrature active filter 16 filters, amplifies, and translates the raw quadrature modulation high signal 7 and raw quadrature modulation low-signal 7' into a conditioned quadrature modulation high signal 17 relative to a conditioned quadrature modulation low signal 17'.

The differential in-phase and quadrature signals will typically be conditioned prior to their introduction to the modulator portion of the circuit. Such conditioning would typically involve filtering, translation from current to voltage, and possibly buffering or amplification. In the example circuit above, the raw in-phase modulation high signal 4 and a raw in-phase modulation low-signal 4' are sent into an in-phase active filter 13 which filters, amplifies, and translates the signal to voltage, creating the conditioned in-phase modulation high signal 14 relative to a conditioned in-phase modulation low signal 14'. In a similar manner, the quadrature active filter 16 filters, amplifies, and translates the raw quadrature modulation high signal 7 and raw quadrature modulation low-signal 7' into a conditioned quadrature modulation high signal 17 relative to a conditioned quadrature modulation low signal 17'.

The I-Q modulator 20 includes an in-phase amplifier 23, a quadrature amplifier 26, mixers 33, 36, a phase shifting splitter 31, and a modulator transformer 41. The in-phase amplifier 23 is coupled to both the in-phase active filter 13 and the mixer 33. The quadrature amplifier 26 is coupled to both the quadrature active filter 16 and the mixer 36. Both of the mixers 33, 36 are coupled to the phase shifting splitter 31 and the modulator transformer 41 which is coupled to a modulator matching circuit 50.

The conditioned differential in-phase and quadrature signals are sent to the I-Q modulator 20 for up-conversion, a process comprised of mixing these signals with a carrier signal 30 in an in-phase and quadrature manner. The steps of up-conversion are performed in the following orderly manner across nearly all I-Q modulation components and circuits.

First, the conditioned in-phase modulation high signal 14 relative to the conditioned in-phase modulation low signal 14' is amplified and translated back to current by the in-phase amplifier 23, creating an input in-phase modulation high signal 24 relative to an input in-phase modulation low signal 24'. Similarly, the conditioned quadrature modulation high signal 17 relative to the conditioned quadrature modulation low signal 17' is amplified and translated back to current by the quadrature amplifier 26, creating an input quadrature modulation high signal 27 relative to an input quadrature modulation low signal 27'. The differential input signals are ready for presentation to the mixers 33, 36. Second, the carrier signal 30 is prepared for presentation to the mixers by sending it to the phase shifting splitter 31. The phase shifting splitter 31 creates a split in-phase carrier signal 32 with a relative phase difference between it and the original carrier signal 30. In certain implementations of an I-Q modulator 20 this phase difference will be zero, representing a phase of 360 degrees or a multiple of 360 degrees.

Additionally, the phase shifting splitter 31 also creates a split quadrature carrier signal 35 with a relative phase difference between it and the split in-phase carrier signal 32. In typical implementations of an I-Q modulator 20, including this example, this phase difference will be 90 degrees. This phase difference forms the basis for the definition of in-phase and quadrature (one quarter of 360 degrees) signals. Each of the split in-phase carrier signal 32 and split quadrature carrier signal 35 will, in certain implementations of an I-Q modulator 20, be unbalanced signals referenced to ground. In other implementations, the carrier signals will be balanced, where the transition from unbalanced to balanced signals will have taken place prior to the circuit of the I-Q modulator 20.

The in-phase mixer 33 is presented with the input in-phase modulation high signal 24 relative to input in-phase modulation low signal 24' as well as the split in-phase carrier signal 32. The in-phase mixer 33 then mixes the modulation signal into the carrier signal, creating an output differential signal comprising an in-phase upconverted high signal 34 relative to an in-phase upconverted low signal 34'. Similarly, the quadrature mixer 36 is presented with the input quadrature modulation high signal 27 relative to input quadrature modulation low signal 27' as well as the split quadrature carrier signal 35. The quadrature mixer 36 mixes the modulation signal into the carrier signal, creating a quadrature upconverted high signal 37 relative to a quadrature upconverted low signal 37'.

The upconverted signals are then transformed into a single differential powered output. Transformer power 40 is presented to the modulator transformer 41 along with the in-phase upconverted high signal 34 relative to its in-phase upconverted low signal 34' and the quadrature upconverted high signal 37 relative to its quadrature upconverted low signal 37'. The modulator transformer 41 transforms these inputs into a single differential output comprising a modulator output high signal 47 relative to a modulator output low signal 47'. The circuit 500 further includes the modulator matching circuit 50. This differential output signal is typically presented to the modulator matching circuit 50 that matches outputs and transforms them to a single unbalanced modulated signal 57 ready for amplification and transmission.

The primary advantage of the circuit 500 is that a wide variety of modulation techniques can be used to encode data sent to the DDS 1, and therefore it can be used to replicate old-fashioned, modern, and possibly future types of waveforms. The I-Q modulator 20 is agnostic to its inputs to the limits of its precision across the frequency range of its use, and these inputs can even be pre-tuned in an open-loop or closed-loop fashion to address non-linearities or frequency-dependent characteristics such as carrier-output isolation. Any type of waveform can be generated up to the bandwidth and precision limits of the components selected and operating conditions applied by those skilled in the art.

The primary disadvantages of the circuit 500 are that it is both costly and power-hungry. The circuit 500 requires the DDS 1, the active I-V conversion circuit, and the I-Q modulator 20 in addition to higher initial data generation requirements. These components, including additional clocking and other support components, currently cost approximately $55 and consume over 1.3 W of power.

SUMMARY OF THE DISCLOSURE

The disclosure is directed to an apparatus that is comprised of a processor, a tuning voltage generator, a tuning circuit, an amplifier, and a VCO. The processor generates a tuning voltage command and a modulation command signal. The tuning voltage generator, coupled to the processor, receives the tuning voltage command and generates a baseline analog tuning signal based on the received tuning voltage command. The amplifier, coupled to the tuning voltage generator, receives the baseline analog tuning signal and the modulation signal, and generates a tuning signal based on the received baseline analog tuning signal and the received modulation command signal. The VCO, coupled to the amplifier, receives the tuning signal, generates a modulated radio frequency output signal based on the received tuning signal, and outputs the modulated radio frequency output signal, the modulated radio frequency output signal emulating a communication waveform.

In at least one embodiment, the modulation signal modifies at least one of a phase and a frequency of the modulated radio frequency output signal.

In at least one embodiment, the tuning circuit is comprised of a resistor and capacitor network to receive the modulation command signal and to generate the modulation signal.

In at least one embodiment, the resistor and capacitor network is comprised of first, second, and third resistors in parallel and a capacitor in parallel with the first, second, and third resistors.

In at least one embodiment, at least one resistor, of the resistor and capacitor network, changes a frequency of the output modulated radio frequency output signal and a capacitor, of the resistor and capacitor network, changes both a frequency and phase of the output modulated radio frequency output signal.

In at least one embodiment, the amplifier is an operational amplifier. In at least one embodiment, the microprocessor is a Cypress Semiconductor Programmable System-On-Chip (PSOC) 5 with an input/output speed of 79 MHz In at least one embodiment, the tuning signal is changed by discrete steps over a time period.

In at least one embodiment, the tuning signal is changed by the discrete steps over the time period between approximately 50 nsec and 1 usec per step.

In at least one embodiment, the communication waveform is a digital spread spectrum communication waveform including channels stepped in a monotonic or pseudorandom fashion such that digital spread spectrum increments are different over time, with the digital spread spectrum communication waveform being emulated in a time-division duplexed manner.

The disclosure is also directed to a method comprising generating, by a processor, a tuning voltage command and a modulation command signal, and generating a baseline analog tuning signal based on the tuning voltage command. The method further comprises generating a modulation signal based on the modulation command signal, generating a tuning signal based on the baseline analog tuning signal and modulation command signal, and applying the modulation signal and the tuning signal to a voltage-controlled oscillator (VCO). The method further comprises generating, by the VCO, a modulated radio frequency output signal based on the received tuning signal, the modulated radio frequency output signal emulating a communication waveform, and outputting, by the VCO, the modulated radio frequency output signal.

In at least one embodiment, the modulation signal, of the method, modifies at least one of a phase and a frequency of the modulated radio frequency output signal.

In at least one embodiment, the modulation signal, of the method, is generated with a resistor and capacitor network based on the modulation command signal.

In at least one embodiment, the resistor and capacitor network, of the flowchart method, is comprised of first, second, and third resistors in parallel and a capacitor in parallel with the first, second, and third resistors in parallel.

In at least one embodiment, at least one resistor, of the resistor and capacitor network of the method, changes a frequency of the output modulated radio frequency output signal and a capacitor, of the resistor and capacitor network, changes both a frequency and phase of the output modulated radio frequency output signal.

In at least one embodiment, the method further comprises changing, by at least one resistor of the resistor and capacitor network, a frequency of the output modulated radio frequency output signal and changing, by a capacitor of the resistor and capacitor network, both a frequency and phase of the output modulated radio frequency output signal In at least one embodiment, the communication waveform, of the method, is a digital spread spectrum communication waveform including channels stepped in a monotonic or pseudorandom fashion such that digital spread spectrum increments are different over time, with the digital spread spectrum communication waveform being emulated in a time-division duplexed manner.

In at least one embodiment, the method further comprises changing the tuning signal by discrete steps over a time period.

In at least one embodiment, the tuning signal of the method, is changed by the discrete steps over the time period between approximately 50 nsec and 1 usec per step.

BRIEF DESCRIPTION OF THE DRAWINGS

The disclosure will now be described with reference to the drawings wherein.

DETAILED DESCRIPTION OF THE DISCLOSURE

Figure 1:
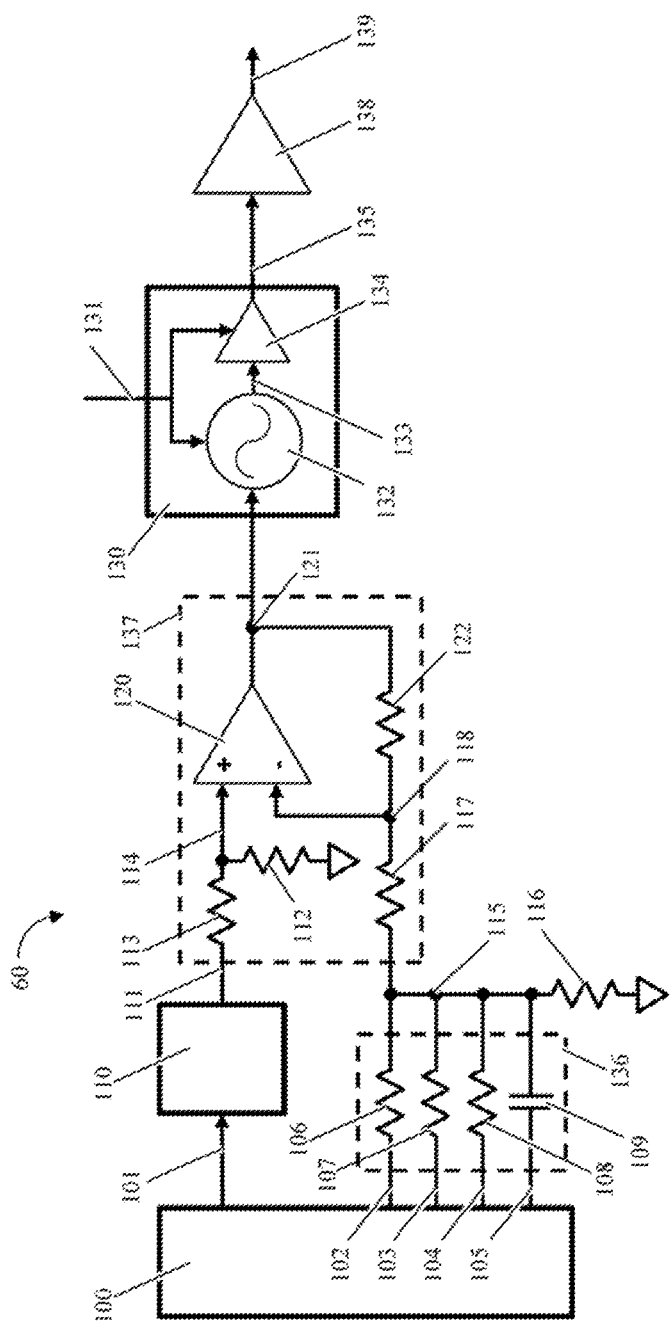
FIG. 1 illustrates an example of a circuit to modify an input tuning voltage of a VCO in a rapid manner to emulate a center frequency with frequency or phase shift keying, in accordance with the embodiments herein.

While this disclosure is susceptible of embodiment in many different forms, there is shown in the drawings and described herein in detail a specific embodiment(s) with the understanding that the present disclosure is to be considered as an exemplification and is not intended to be limited to the embodiment(s) illustrated.

It will be understood that like or analogous elements and/or components, referred to herein, may be identified throughout the drawings by like reference characters. In addition, it will be understood that the drawings are merely schematic representations of the embodiments, and some of the components may have been distorted from actual scale for purposes of pictorial clarity.

FIG. 1 illustrates an example of a circuit 60 to modify an input tuning voltage of a VCO 130, such as an analog VCO, in a rapid manner to emulate a center frequency with frequency or phase shift keying, in accordance with the embodiments herein. Referring now to the drawings and in particular to FIG. 1, the embodiments enable a low-cost, low-complexity example circuit 60 to generate a fast-moving waveform that emulates significantly more complex communications waveforms at a high rate of speed. The circuit 60 includes a processor 100, such as a microprocessor, which generates control commands for the circuit 60. The circuit 60 further includes a tuning voltage generator 110 that is coupled to the processor 100, the tuning voltage generator 110 generating an analog signal that is used for tuning the VCO 130 to a desired nominal baseline frequency. The circuit 60 even further includes an amplifier 120, such as a summing operational amplifier, that is coupled to the tuning voltage generator 110, the amplifier 120 conditioning the analog tuning signal for use by the VCO 130 as well as adding the modulation signals of the embodiments. The circuit 60 yet even further includes the VCO 130 that is coupled to the amplifier 120, the VCO 130 generating an RF signal based on the tuning voltage presented by the buffering amplifier, and which corresponds to the modulation signals described herein.

The processor 100 generates a tuning voltage command 101 which contains the necessary data for the tuning voltage generator 110 to create a baseline analog tuning signal at node 111 of an appropriate type. The baseline analog tuning signal at node 111 is conditioned using a resistor network comprising a baseline tuning series resistor 113, one side of which is coupled to node 111 and the other side of which is coupled to a first input of the amplifier 120, and a baseline tuning shunt resistor 112, one side of which is coupled to node 114 and the other side of which is coupled to electrical ground, with the conditioned analog tuning signal 114 resulting and being sent into the amplifier 120 as a positive input forming part of an amplifier circuit 137 capable of providing a strong drive signal. The power connections for the amplifier 120 are not shown. The buffered tuning signal on node 121 is the primary output of this stage, and is fed back through a tuning feedback resistor 122 one side of which is coupled to a node 118 and the other side of which is coupled to node 121, node 118 also being coupled to a second input of the amplifier 120, to create a buffered feedback signal. In a typical operational amplifier circuit not incorporating the features of the presently disclosed embodiments, this buffered feedback signal would also have a capacitor or resistor component/network to ground or other reference signal. In the first two techniques of the presently disclosed subject matter, however, this circuit node 118 is presented with additional signals.

The processor 100 further generates a first modulation command 102, a second modulation command 103, a third modulation command 104, and a fourth modulation command 105 using high-speed or general-purpose input/output (GPIO) digital signal nodes. These signals will typically be of a moderate drive strength with a moderately low voltage (e.g., 1.8V) representing the digital "high" of the processor 100, and capable of being driven with a clock signal, data signal, or encoded digital signal at a high rate of speed limited to the performance characteristics of the processor 100 and the time constant of the signal line and components. In at least one embodiment, the processor 100 is a Cypress Semiconductor PSOC 5 capable of GPIO speeds of 79 MHz. It is contemplated in other embodiments of the presently disclosed subject matter that the role of the processor 100 could be any number of available microprocessor components, such as a systems-on-a-chip (SOCs). In an embodiment, the processor 100 employs a digital-to-analog converter (DAC) (not shown) for the generation of a tuning voltage command, the tuning voltage generator can be instantiated by a buffering operational amplifier circuit (not shown). It is additionally contemplated that if the processor 100 employed a DAC for the generation of modulation commands instead of using digital GPIO commands, fine resolution of modulation commands can be obtained as well as the potential for other synthesized waveforms such as ramps, saw-tooth waves, and other methods of rapidly changing a tuning voltage command or modulation signal prior to engaging with the rest of the circuit 60.

In certain embodiments of the presently disclosed subject matter, the modulation commands are transformed in signal characteristics and summed together to form a modification to the negative feedback port of the amplifier 120. The circuit 60 further includes a first modulation resistor 106, a second modulation resistor 107, and a third modulation resistor 108, one side of each of which are coupled to the processor 100 and the other side of each of which are coupled to a summing common modulation node 115. The first modulation command 102 is sent through the first modulation resistor 106, with the output representing a current summing at the common modulation node 115. Similarly, the second modulation command 103 is sent through the second modulation resistor 107 and the third modulation command 104 sent through the third modulation resistor 108 to the same common modulation node 115.

The impact of each of these first three modulation commands is that they provide a direct voltage change on the common modulation node 115, with the magnitude of their impact based on the voltage division circuit formed by their own respective modulation resistors 106, 107, 108 and the shunt modulation resistor 116 one side of which is coupled to common modulation node 115 and the other side of which is coupled to electrical ground. In an embodiment, the resistance values for these modulation resistors are 75 kOhm for the modulation resistor 106, 150 kOhm for the modulation resistor 107, 300 kOhm for the modulation resistor 108, and the resistance value for the shunt modulation resistor 116 is 180 Ohms. The result of this resistor network is that the first three modulation commands provide three bits of resolution with binary weighting to change the voltage on the common modulation node 115 by up to 18 mV. This provides for a frequency shift keyed (FSK) waveform with independently selectable voltage level having eight options (e.g., 8 FSK) able to modulate at tens of MHz speeds with a minimum of additional components and circuit routing.

The fourth modulation command 105 is sent to a modulation capacitor 109 one side of which is coupled to processor 100 and the other side of which is coupled to the common modulation node 115, instead of a modulation resistor. The toggling of a capacitive element results in a high-frequency "jolt" to the voltage level of the summing node. This rapidly changing voltage returns quickly to its nominal value, but when this change is large enough and fast enough, it can result in the disruption of the amplifier 120 creating the tuning voltage, and subsequently force a phase change on the VCO 130. As a secondary impact of this voltage change, there is also a fast change in frequency modulation that must additionally occur. Together these four commands provide a total of 3 bits of frequency modulation and 1 bit of coupled phase modulation presented at the common modulation node 115. This combined signal is passed through a modulation dampening resistor 117, one side of which is coupled to the common modulation node 115 and the other side of which is coupled to node 118, and combined with the buffered feedback signal at node 118.

The buffered tuning signal at node 121 is sent to the VCO 130 along with VCO power 131. The oscillator element 132 generates a low-power RF signal 133 of a frequency determined by the buffered tuning signal on node 121. As the buffered tuning signal on node 121 contains the modulation information provided by the common modulation node 115, and the signal is strong enough to quickly slew the VCO 130 output frequency, the low-power RF signal 133 will already contain the desired modulation content. The low-power RF signal 133 is amplified by the VCO amplifier 134 and is output by the VCO amplifier 134 as a modulated RF output signal 135.

It is contemplated in other embodiments of the presently disclosed subject matter than that illustrated by FIG. 1 that other combinations of frequency and phase modulation can be used to provide greater or fewer options to those skilled in the art. For example, if eight GPIO pins were used for frequency modulation and four GPIO pins used for phase modulation, up to 12 independent bits of modulation options can be available for emulating a wide variety of communication waveforms. It is further contemplated that non-binary weighting can be used instead of binary weighting of different frequency or phase modulation resistors and capacitors to provide different options. It is further contemplated that multiple scaling options and dampening or conditioning components for two or more summing nodes of different configurations can be used to provide different options and time constants for different modulation effects. It is further contemplated that one or more summing nodes can tap into the positive input instead of the negative input, providing different responses and a second category of options for projecting modulation into the buffering amplifier inputs.

The theory of operation of the third and fourth modulation techniques are associated with waveform emulation using strong drive control commands given to the VCO. These two techniques are fully complementary with and separate from the previously disclosed techniques, and may be used independently or may be used in conjunction. These techniques are associated with the generation of the nominal baseline frequency in order to generate a waveform that can emulate a waveform having a wide channel bandwidth and/or a rapidly changing data encoding method, such as an IEEE 802.11h Wi-Fi signal. In certain implementations of the presently disclosed subject matter, the first two techniques may be limited to a relatively small frequency change (~0.1%) for a recommended maximum frequency modulation for analog VCOs. The maximum frequency modulation recommended will be dependent on the specific component and circuit characteristics of the elements used by those skilled in the art. If the user needs to emulate a signal with a much wider bandwidth, however, a different technique is provided for in the figures below.

In an example, the VCO 130 is a monolithic microwave integrated circuit VCO with buffering amplifier. Such an example is an Analog Devices HMC385LP4, which tunes from 2.25 to 2.5 GHz based on the input tuning voltage range of 0 to 10V and with moderate output power of a few dBm having low phase noise of −115 dBc/Hz. Such a device is typical for the communications industry for use in wireless infrastructure, industrial controls, test equipment, and military applications. The output frequency can change at a high slew rate (~500 MHz per microsecond) but only when presented with a strongly driven tuning signal. The function of the amplifier 120 therefore necessarily includes the capability of driving the VCO 130 at a slew rate required by the modulation speeds the circuit 60 is emulating.

Both frequency and phase shift-keyed data may be encoded on this low-complexity waveform in a manner that may be decoded by a receiver (not shown), or may be used to increase bit error rates (BERs) of unsynchronized receivers (not shown) operating in the same band in overlapping channels. The embodiments use low-complexity command signals for both data and channel selection at high rates of speed compared to the capabilities of typical low-cost communication systems used and/or developed by those skilled in the art. The present embodiments also allow for emulation of multiple waveforms in a fast-switching time-division-duplexed manner. The techniques disclosed are scalable and software-adaptable to reconfigure multi-bit modulation options quickly and inexpensively in either a development environment, as well as in production, and sustainment of products incorporating the presently disclosed embodiments.

The waveforms described by the embodiments are substantially better at emulating modern communication waveforms used by, for example, remotely piloted ground and air vehicles for command, control, telemetry, and video data than are simple waveforms having no direct modulation or one-bit modulation techniques. This improved emulation results in higher BERs generated in target radio systems while transmitting lower power levels, as the target radios believe the emulated signals contain data they are supposed to be focusing on. The present embodiments are adaptable and reconfigurable through both hardware and software to be able to emulate many types of communication signals and waveform types.

Present products that employs "broadband jammer" type solutions that attempt to overwhelm target remotely piloted ground and air vehicle radios would substantially improve their effective range and interference levels using any one or more of the four techniques of the presently disclosed embodiments. As the cost and complexity of implementing these emulation techniques is extremely low, it is highly desirable to implement any one or more of these techniques. Superior performance of the embodiments is evident in comparison of specifications of competing broadband jammers that typically consume 10× the power consumed by the circuit 60 with several times the size and weight of the circuit 60, while having substantially equivalent overall performance.

In comparison to the circuit 500, the circuit 60 of the presently disclosed embodiments utilizes low cost components and low power. Although the DDS 1 with I-Q modulator 20 combination of the circuit 500 is more capable of emulating complex waveforms, such capability is wasted and not necessary for some applications of the circuit 500, such as to disable, disrupt and/or destroy drones.

The embodiments disclosed solve the problem of the typical circuit 500 by implementing four complementary circuit and control command techniques. The first and second techniques are hardware circuit configurations providing for a tuning circuit 136, such as a resistor and capacitor network, between a set of digital general purpose (or high speed) input/output nodes, such as pins, of a processor 100, such as a microprocessor, and the input node 111 of the amplifier circuit 137 used otherwise to nominally drive the tuning voltage of the VCO 130. The third and fourth techniques are control command techniques to adjust the center frequency of the VCO 130 in a rapid manner that permits the emulation of different types of waveforms using DSS of both slowly changing and rapidly changing signals in a time-division duplexed (TDD) manner.

Figures 2, 3:
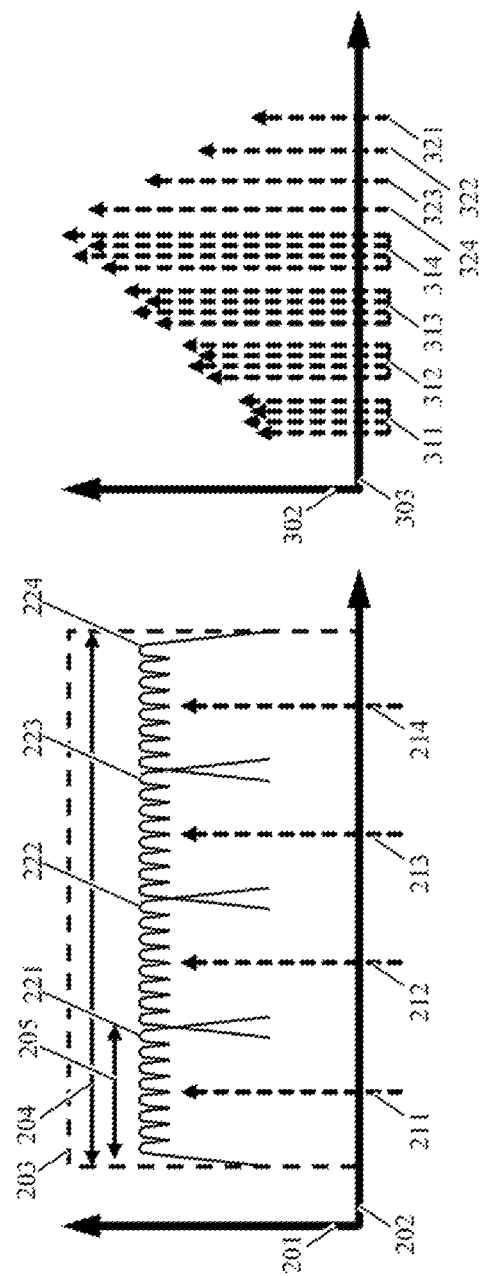
FIG. 2 illustrates a sequence of center frequencies generated by the VCO of FIG. 1 across a span representing a single channel in a frequency hopping spread spectrum (FHSS) radio, in accordance with the embodiments herein.
FIG. 3 illustrates a sequence of center frequencies hopping across channels with a time-varying number of digital spread spectrum (DSS) subchannels, in accordance with the embodiments herein.

The embodiments of the presently disclosed subject matter may be implemented using any partial, total, or equivalent combination of any one or more of the following four techniques described. FIG. 2 illustrates the first two techniques combined in a single example circuit implementation. FIG. 3 illustrates the last two techniques combined in a single command set.

In the first technique, the tuning circuit 136 enables a fine control of current contributions to the input node of the amplifier circuit 137 otherwise being used to drive the VCO 130. This tuning circuit 136 permits a high-speed multi-bit digital signal to rapidly create small changes in tuning voltage and therefore rapid changes in resulting frequency output as a frequency modulation of the VCO 130.

In a complementary fashion, the capacitor 109, within the tuning circuit 136, enables a disruptive transition of current contributions to the input node 111 of the amplifier circuit 137, permitting rapidly changing voltages on the input node to the VCO 130, which results in both frequency and phase shift due to the disruptive nature of a capacitive change on the tuning node.

In the third technique, a wideband DSS communication waveform is emulated by changing the drive voltage, such as the tuning signal on node 121, of the VCO 130 by discrete steps over a short time period, generally defined as between approximately 50 nsec and 1 usec per step. This results in frequency content of the VCO output changing across a wider range than that achieved by the first technique. In an example, this utilizes a fast-changing VCO, which is typically quite difficult to achieve in phase-locked-loop architectures. The embodiments achieve this by using an offset based on an open-loop, a phase-locked-loop baseline center frequency, or initial frequency, with DSS stepping of frequencies across a range intended for waveform emulation.

In the fourth technique, a DSS communication waveform having channels stepped in monotonic or pseudorandom fashion is modified such that the DSS increments are different over time, so that both fast moving and slow-moving waveforms can be emulated in a time-division duplexed manner. For example, a waveform could have a four-step DSS per channel while stepping upwards in channel number, but every step downwards in channel number used a one-step DSS instead. This technique is specifically known to be valuable for causing increased bit-error-rate (BER) in both radio-controlled protocols, which can be requiring higher power levels and modulation time per channel, as well as Wi-Fi based protocols, which can be requiring rapid changes in frequency and reduced modulation time per channel.

FIG. 2 illustrates an example sequence of center frequencies generated by the VCO 130 across a span representing a single channel in a frequency hopping spread spectrum (FHSS) radio. In this case, the VCO 130 is moving its center frequency to cover multiple frequency locations across what would be considered a single channel of a target radio receiver. This is equivalent to a digital spread spectrum (DSS) approach with a comparably small number of DSS subchannels. Each subchannel can then be frequency and/or phase modulated using the first two techniques in the presently disclosed subject matter, providing for a broad coverage of frequency content emulating the target radio's channel.

The example of FIG. 2 represents a 10 MHz bandwidth Wi-Fi channel that is emulated by a modulated analog VCO signal, such as the modulated RF output signal 135, capable of only 2.5 MHz bandwidth. In FIG. 2, the vertical power axis 201 is plotted over the horizontal frequency axis 202. The dashed envelope of a Wi-Fi channel band 203 is illustrated as having a Wi-Fi channel bandwidth 204 that is four times wider than the frequency modulation bandwidth 205 of around its first center frequency 211 schematically illustrated as the first modulated signal 221 having eight small peaks of energy having different frequencies.

In the example of FIG. 2, frequency modulation bandwidth 205 is comprised of a frequency modulated signal having three bits, such as what might be generated by the example circuit 60 of FIG. 1, around its first center frequency 211. The wider Wi-Fi channel can be emulated in a DSS manner with four subchannels as the center frequency is moved between four different positions and the modulation proceeding at a higher rate of speed around the center frequencies. The addition of the second modulated signal 222 around the second center frequency 212, third modulated signal 223 around the third center frequency 213, and the fourth modulated signal 224 around the fourth center frequency 214 complete the emulated waveform. Using this third technique as a hybrid of DSS and FSS with FSK modulation permits a wide range of broadband waveforms that may be emulated.

FIG. 3 illustrates a sequence of center frequencies hopping across channels with a time-varying number of DSS subchannels. This provides for a short period of time spent on any one channel region to emulate a fast-moving modulation waveform, as well as a long period of time spent on other channels to emulate slower-moving modulation waveforms that use more modulation time on channel on target.

The example of FIG. 3 illustrates a technique performed by the circuit 60 to produce another modulated analog VCO signal, such as the modulated RF output signal 135, that enables both slow and fast channel hopping using the hybrid DSS/FSS technique previously described. The fast channel hops increase BER generation in wide-band spread spectrum communication events, whereas the slower channels hops with multiple DSS increases BER generation in RF protocol communication events. In FIG. 3, the vertical frequency axis 302 is plotted over the horizontal time axis 303. The transmission timing begins with a first 4DSS channel 311, illustrating four center frequencies such as those shown in the example of FIG. 2, and not illustrating the finer frequency modulation of these signals. The time-based order of the 4DSS transmissions shows the lowest frequency DSS subchannel is transmitted first, then the third, then second, and the highest frequency DSS last, which provides both positive frequency shift keying content as well as negative frequency shift keying content. After the fourth DSS subchannel of the first 4DSS channel 311 is transmitted, the system moves to the second 4DSS channel 312 using a similar subchannel transmission timing. Similarly, a third 4DSS channel 313 and fourth 4DSS channel 314 are subsequently transmitted.

The fourth technique of the presently disclosed subject matter follows, in that the DSS subchannel division is changed dynamically for the following transmissions. The fourth 1DSS channel 324 is transmitted next in time, but contains no subchannels with time of transmission on a per-channel basis of only one fourth. This permits channels to be cycled through rapidly, which increases BER for waveforms having significant error correction code such as IEEE 802.11n Wi-Fi. In the example of FIG. 2B, the 4DSS transmissions have a transmit time of four microseconds per channel, but the 1DSS transmissions have a transmit time of only one microsecond per channel. It therefore takes only four microseconds to transmit the fourth 1DSS channel 324, the third 1DSS channel 323, the second 1DSS channel 322, and the first 1DSS channel 321.

It is contemplated that in other embodiments that the transmit time of subchannels may be substantially shorter or longer than the one-to-four microseconds per transmission used in the example of FIG. 3, and might range from tens of nanoseconds up to hundreds of milliseconds per communication event depending on the type of radio communication waveform being emulated.

It is contemplated in other embodiments of the presently disclosed subject matter that the number of DSS subchannels would be varied from one through hundreds, with some waveforms supporting widely differing numbers of subchannels transmitted in a time-division duplexed or frequency-division duplexed manner simultaneously. It is further contemplated that in other embodiments of the presently disclosed subject matter that the main channels will not be progressed in a monotonic upwards or downwards fashion, and instead will vary in a pre-generated and/or pseudo-random fashion, with the speed of channel hopping limited to the circuit configuration developed by those skilled in the art. It is similarly contemplated that the order in which high-DSS and low-DSS sub-channelization will also vary in certain embodiments of the presently disclosed subject matter, so that rapid frequency movement and slower frequency movement will be interspersed. It is anticipated that error correction attempts to compensate for waveforms emulated in this manner will be more challenging for target receivers attempting to communicate in the presence of such signals.

Figure 4:
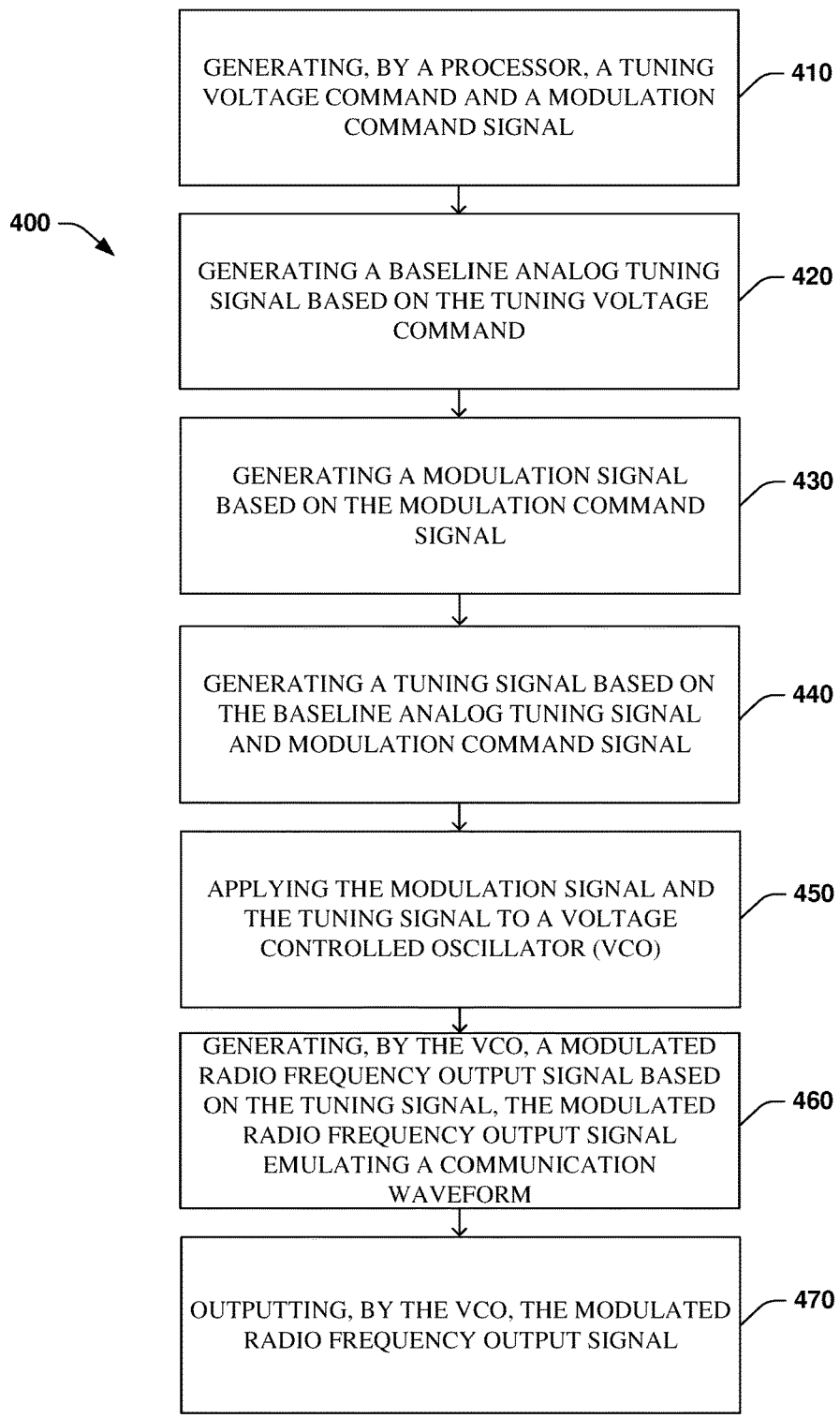
FIG. 4 illustrates an example flowchart for generating a modulated radio frequency output signal emulating a communication waveform, in accordance with the embodiments herein.
Figure 5:
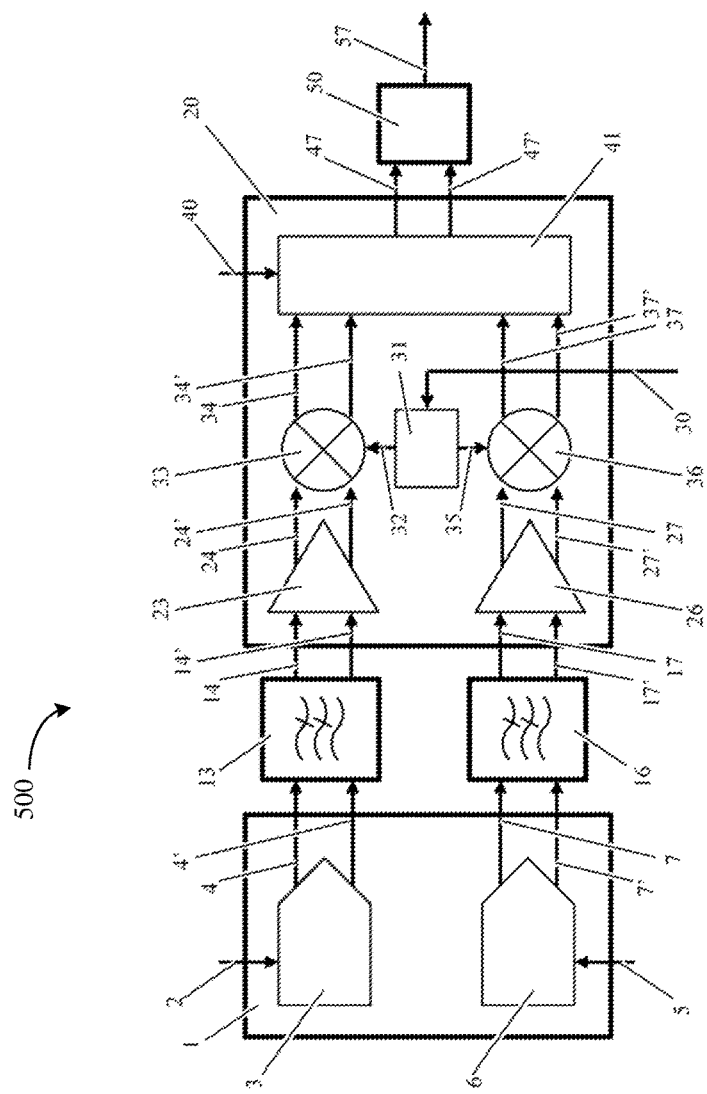
FIG. 5 illustrates an example of a prior art circuit representing a state of the art in communications waveform generation.

FIG. 4 illustrates an example flowchart 400 for a method of generating the modulated radio frequency output signal emulating the communication waveform, in accordance with the embodiments herein. In at least one embodiment, the flowchart 400 can be implemented with the circuit 60 illustrated in FIG. 1. Block 410 includes generating by a processor, such as the processor 100, the tuning voltage command and the modulation command signal. Block 420 includes generating the baseline analog tuning signal based on the tuning voltage command. In at least one embodiment, a tuning voltage generator, such as the tuning voltage generator 110 coupled to the processor 100, receives the tuning voltage command and generates the baseline analog tuning signal based on the received tuning voltage command.

Block 430 includes generating the modulation signal based on the modulation command signal. In at least one embodiment, a tuning circuit, such as the tuning circuit 136 coupled to the processor 100, receives the modulation command signal from the processor 100 and generates the modulation signal based on the received modulation command signal. Block 440 includes generating the tuning signal based on the baseline analog tuning signal and modulation command signal. In at least one embodiment, an amplifier, such as the amplifier 120 coupled to the tuning voltage generator 110, receives the baseline analog tuning signal and the modulation signal, and generates the tuning signal based on the received baseline analog tuning signal and the received modulation command signal.

Block 450 includes applying the modulation signal and the tuning signal to a VCO, such as the VCO 130. Block 460 includes generating, by the VCO 130, the modulated radio frequency output signal based on the tuning signal, the modulated radio frequency output signal emulating a communication waveform. Block 470 includes outputting, by the VCO 130, the modulated radio frequency output signal. In at least one embodiment, this modulated radio frequency output signal is generated by the VCO amplifier 134.

In at least one embodiment, the modulation signal, of the flowchart 400, can modify at least one of a phase and a frequency of the modulated radio frequency output signal. In at least one embodiment, the modulation signal, of the flowchart 400, can be generated with a resistor and capacitor network based on the modulation command signal. In at least one embodiment, this resistor and capacitor network is comprised of first, second, and third resistors in parallel and a capacitor in parallel with the first, second, and third resistors in parallel. In at least one embodiment, at least one resistor, of this resistor and capacitor network, changes a frequency of the output modulated radio frequency output signal and a capacitor, of the resistor and capacitor network, changes both a frequency and phase of the output modulated radio frequency output signal.

In at least one embodiment, the flowchart 400 can further comprise changing, by at least one resistor of the resistor and capacitor network, a frequency of the output modulated radio frequency output signal and changing, by a capacitor of the resistor and capacitor network, both a frequency and phase of the output modulated radio frequency output signal. In at least one embodiment, the communication waveform, of the flowchart 400, can be a digital spread spectrum communication waveform including channels stepped in a monotonic or pseudorandom fashion such that digital spread spectrum increments are different over time, with the digital spread spectrum communication waveform being emulated in a time-division duplexed manner. In at least one embodiment, the flowchart 400 can further comprise changing the tuning signal by discrete steps over a time period. In at least one embodiment, this tuning signal is changed by the discrete steps over the time period between approximately 50 nsec and 1 usec per step.

The foregoing description merely explains and illustrates the disclosure and the disclosure is not limited thereto except insofar as the appended claims are so limited, as those skilled in the art who have the disclosure before them will be able to make modifications without departing from the scope of the disclosure.

What is claimed is:

1. An apparatus, comprising:
 a processor to generate a tuning voltage command and a modulation command signal;
 a tuning voltage generator, coupled to the processor, to receive the tuning voltage command and generate a baseline analog tuning signal based on the received tuning voltage command;
 a tuning circuit, coupled to the processor, to receive the modulation command signal from the processor and to generate a modulation signal based on the received modulation command signal;
 an amplifier, coupled to the tuning voltage generator, to receive the baseline analog tuning signal and the modulation signal, and generate a tuning signal based on the received baseline analog tuning signal and the received modulation command signal; and
 a voltage-controlled oscillator (VCO), coupled to the amplifier, to receive the tuning signal, generate a modulated radio frequency output signal based on the received tuning signal, and output the modulated radio frequency output signal, the modulated radio frequency output signal emulating a communication waveform.

2. The apparatus of claim 1, wherein the modulation signal modifies at least one of a phase and a frequency of the modulated radio frequency output signal.

3. The apparatus of claim 1, wherein the tuning circuit is comprised of a resistor and capacitor network to receive the modulation command signal and to generate the modulation signal.

4. The apparatus of claim 3, wherein the resistor and capacitor network is comprised of first, second, and third resistors in parallel and a capacitor in parallel with the first, second, and third resistors.

5. The apparatus of claim 3, wherein at least one resistor, of the resistor and capacitor network, changes a frequency of the output modulated radio frequency output signal and a capacitor, of the resistor and capacitor network, changes both a frequency and phase of the output modulated radio frequency output signal.

6. The apparatus of claim 1, wherein the amplifier is an operational amplifier.

7. The apparatus of claim 1, wherein the processor is a microprocessor.

8. The apparatus of claim 7, wherein the microprocessor is a Cypress Semiconductor Programmable System-On-Chip (PSOC) 5 with an input/output speed of 79 MHz.

9. The apparatus of claim 1, wherein the tuning signal is changed by discrete steps over a time period.

10. The apparatus of claim 9, wherein the tuning signal is changed by the discrete steps over the time period between approximately 50 nsec and 1 usec per step.

11. The apparatus of claim 1, wherein the communication waveform is a digital spread spectrum communication waveform including channels stepped in a monotonic or pseudorandom fashion such that digital spread spectrum increments are different over time, with the digital spread spectrum communication waveform being emulated in a time-division duplexed manner.

12. A method, comprising:
 generating, by a processor, a tuning voltage command and a modulation command signal;
 generating a baseline analog tuning signal based on the tuning voltage command;
 generating a modulation signal based on the modulation command signal;
 generating a tuning signal based on the baseline analog tuning signal and modulation command signal;
 applying the modulation signal and the tuning signal to a voltage-controlled oscillator (VCO);
 generating, by the VCO, a modulated radio frequency output signal based on the received tuning signal, the modulated radio frequency output signal emulating a communication waveform; and
 outputting, by the VCO, the modulated radio frequency output signal.

13. The method of claim 12, wherein the modulation signal modifies at least one of a phase and a frequency of the modulated radio frequency output signal.

14. The method of claim 12, wherein the modulation signal is generated with a resistor and capacitor network based on the modulation command signal.

15. The method of claim 14, wherein the resistor and capacitor network is comprised of first, second, and third resistors in parallel and a capacitor in parallel with the first, second, and third resistors.

16. The method of claim 14, further comprising changing, by at least one resistor of the resistor and capacitor network, a frequency of the output modulated radio frequency output signal and changing, by a capacitor of the resistor and capacitor network, both a frequency and phase of the output modulated radio frequency output signal.

17. The method of claim 12, wherein the communication waveform is a digital spread spectrum communication waveform including channels stepped in a monotonic or pseudorandom fashion such that digital spread spectrum increments are different over time, with the digital spread spectrum communication waveform being emulated in a time-division duplexed manner.

18. The method of claim 12, further comprising changing the tuning signal by discrete steps over a time period.

19. The method of claim 18, wherein the tuning signal is changed by the discrete steps over the time period between approximately 50 nsec and 1 usec per step.

20. The method of claim 18, wherein the communication waveform is a digital spread spectrum communication waveform including channels stepped in a monotonic or pseudorandom fashion such that digital spread spectrum increments are different over time, with the digital spread spectrum communication waveform being emulated in a time-division duplexed manner.

\* \* \* \* \*